United States Patent
Houdebine

(10) Patent No.: US 10,749,719 B2
(45) Date of Patent: Aug. 18, 2020

(54) SYNCHRONIZATION BETWEEN AN OBJECT AND A READER CONTACTLESSLY COMMUNICATING BY ACTIVE LOAD MODULATION

(71) Applicant: STMicroelectronics SA, Montrouge (FR)

(72) Inventor: Marc Houdebine, Crolles (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 16/569,999

(22) Filed: Sep. 13, 2019

(65) Prior Publication Data

US 2020/0099554 A1  Mar. 26, 2020

(30) Foreign Application Priority Data

Sep. 25, 2018  (FR) ..................... 18 58732

(51) Int. Cl.
*H04L 27/00* (2006.01)

(52) U.S. Cl.
CPC .. *H04L 27/0014* (2013.01); *H04L 2027/0016* (2013.01); *H04L 2027/0048* (2013.01); *H04L 2027/0067* (2013.01); *H04L 2027/0073* (2013.01)

(58) Field of Classification Search
CPC . H04B 5/0062; H04L 7/0331; H04L 27/0014; H04L 2027/0016; H04L 2027/0048; H04L 2027/0067; H04L 2027/0073; H04W 4/80

See application file for complete search history.

(56) References Cited

U.S. PATENT DOCUMENTS

| 2008/0100386 | A1 | 5/2008 | Wicpalek et al. |
| 2010/0039183 | A1 | 2/2010 | Chen et al. |
| 2014/0273828 | A1* | 9/2014 | Yang ............... H04B 15/00 455/41.1 |
| 2015/0063517 | A1* | 3/2015 | Verlinden ........... H04L 7/0079 375/376 |
| 2018/0034505 | A1 | 2/2018 | Dedieu et al. |

FOREIGN PATENT DOCUMENTS

| EP | 2763076 A1 | 8/2014 |
| EP | 3276986 A1 | 1/2018 |

* cited by examiner

*Primary Examiner* — Sung S Ahn
(74) *Attorney, Agent, or Firm* — Slater Matsil, LLP

(57) ABSTRACT

A method of contactless communication can be performed between an object and a reader using active load modulation. A synchronization process is performed between a first carrier signal transmitted by the reader and having a reference frequency, and a second carrier signal extracted from an output signal of a controlled oscillator of a digital phase-locked loop of the object. In the synchronization process, as long as a locking of the loop has not been detected, the frequency of the output signal of the oscillator is latched on a frequency that is a multiple of the reference frequency. Once the locking has been detected, the latching continues while controlling the oscillator with a second control signal generated from a second value obtained.

20 Claims, 5 Drawing Sheets

FIG.3
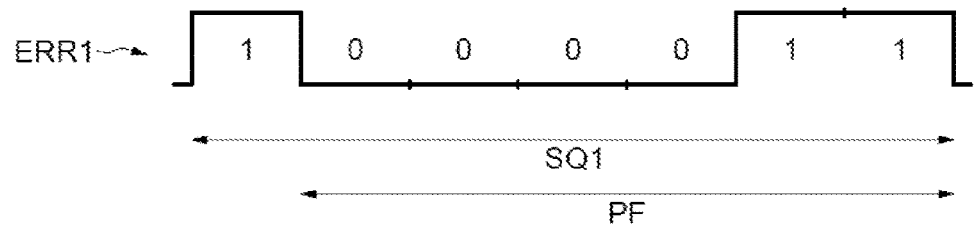
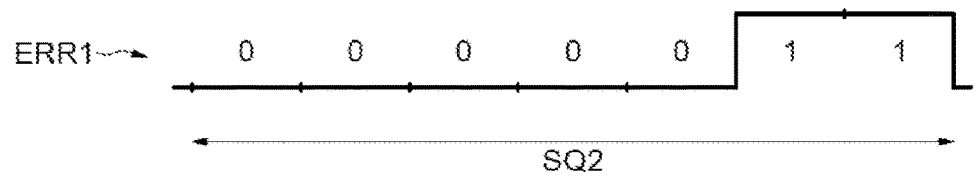
FIG.4A
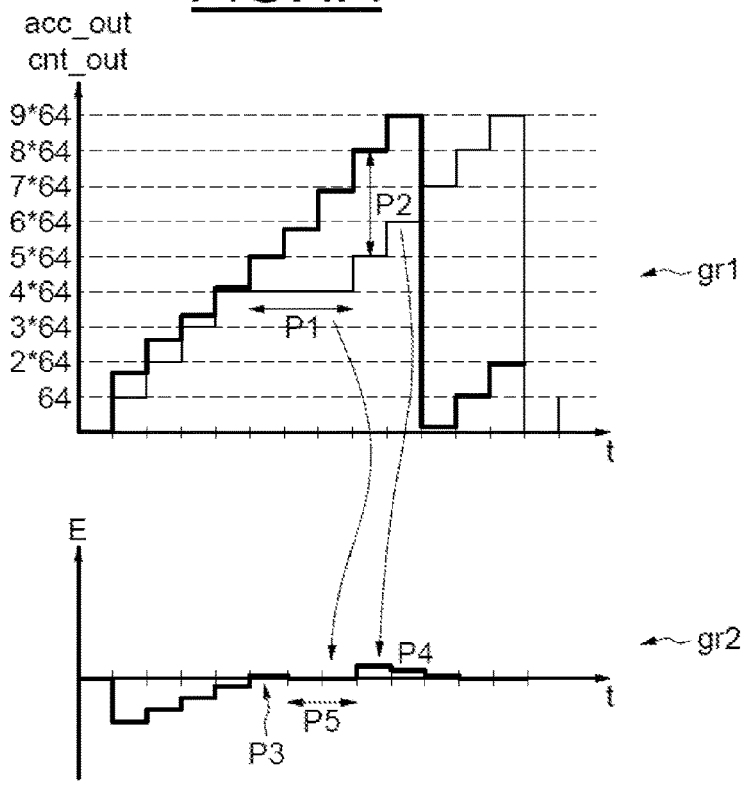

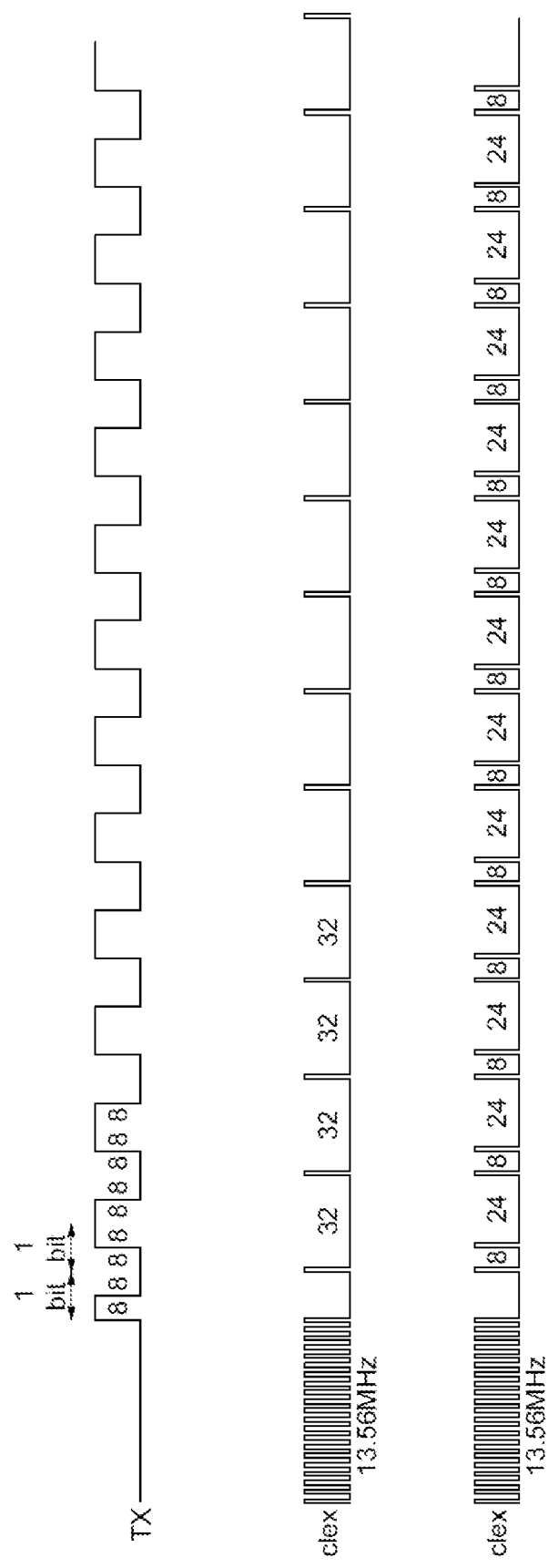

SYNCHRONIZATION BETWEEN AN OBJECT AND A READER CONTACTLESSLY COMMUNICATING BY ACTIVE LOAD MODULATION

CROSS-REFERENCE TO RELATED APPLICATIONS

This application claims priority to French Patent Application No. 1858732, filed on Sep. 25, 2018, which application is hereby incorporated herein by reference.

TECHNICAL FIELD

Embodiments and applications of the invention relate to synchronization between an object and a reader that are contactlessly communicating by active load modulation.

BACKGROUND

Contactless components or devices may be, for example, what are known as "NFC" components or devices, that is to say devices compatible with NFC (Near Field Communication) technology.

The NFC device may be, for example, an integrated circuit or a chip incorporating an NFC microcontroller.

The abbreviation NFC denotes a short-range, high-frequency wireless communication technology which allows data exchanges between two contactless devices over a short distance, for example 10 cm.

NFC technology is an open technology platform governed by the ISO/IEC 18092 and ISO/IEC 21481 standard, but incorporates many pre-existing standards such as the type A and type B protocols defined in the ISO-14443 standard, which may be communication protocols that can be used in NFC technology.

In addition to its conventional function as a telephone, a cellular mobile telephone may be used (if fitted with special circuitry) for exchanging data with another contactless device, for example a contactless reader, using a contactless communication protocol that can be used in NFC technology.

Other contactless devices, such as smartwatches, may also be mentioned.

These enable data to be exchanged between the contactless reader and secure elements located in the mobile telephone. Thus there are many possible applications, such as mobile ticketing in public transport (the mobile telephone acts as a transport ticket) or mobile payment (the mobile telephone acts as a payment card).

When data is transmitted between a reader and an object emulated in tag or card mode, the reader generates a magnetic field by means of its antenna, which, according to the conventionally used standards, is usually a sine wave at 13.56 MHz. The force of the magnetic field is between 0.5 and 7.5 amperes per meter RMS ("Root Mean Square").

Two operating modes are then possible: a passive mode or an active mode.

In passive mode, only the reader generates the magnetic field, and the object, emulated in tag or card mode, is then passive and always acts as the target.

More precisely, the antenna of the object emulating the tag or the card modulates the field generated by the reader. This modulation is performed by modifying the load connected to the terminals of the object's antenna.

When the load at the terminals of the object's antenna is modified, the output impedance of the reader's antenna changes because of the magnetic coupling between the two antennas. This causes a change in the amplitudes and/or phases of the voltages and currents present in the antennas of the reader and the object.

Thus the data to be transmitted from the object to the reader are transmitted by load modulation to the antenna currents of the reader.

The load variation carried out during the load modulation results in a modulation of the amplitude and/or phase of the signal (voltage or current) at the reader's antenna. A copy of the antenna current is generated and injected into the receiving circuitry of the reader, where this current is demodulated and processed to extract the transmitted data.

In the active operating mode, the reader and the object emulated in card mode both generate an electromagnetic field. This operating mode is generally used when the object is provided with its own power source, for example a battery, as is the case in a cellular mobile telephone which is then emulated in card mode.

Each of the NFC devices transmits the data using a modulation scheme.

Here again, the modulation results in a modification of the load, and we then speak of communication by active load modulation.

By comparison with a passive communication mode, this results in longer operating distances, possibly as long as 20 cm, depending on the protocol used.

Using active load modulation also enables very small antennas to be used.

However, this type of communication by active load modulation poses other problems.

During the active communication periods of the device emulated in card mode, the electromagnetic field of the reader is not directly observable. This may result in a non-synchronous response of the object emulated in card mode, and consequently the signal received by the reader may exhibit a phase shift, particularly in long periods of transmission by the device emulated in card mode.

This is even more apparent when the device emulated in card mode performs a digital modulation of the BPSK (Binary Phase-Shift Keying) type, and transmits the data to the reader using the type B communication protocol at a speed of 848 Kbits/s.

Additionally, to ensure that a phase-locked loop is stable, the use of a fixed frequency is recommended. For this purpose, it is best to restore some pulses of the received signal during a series of pulses. The received signal may therefore have a frequency up to 32 times lower, thus limiting the passband of the phase-locked loop. This limitation leads to instability in the system.

Furthermore, when the device emulated in card mode executes Manchester coding for transmitting data to the reader and uses the type A communication protocol at a speed of 106 kbit/s, this leads to a phase shift.

If there are two independent devices, namely the reader and an object emulated in card mode, capable of contactless communication by active load modulation, there is a need to minimize, or even suppress, this phase shift.

SUMMARY

Embodiments and applications of the invention relate to wireless or contactless communication using contactless devices or electronic components connected to an antenna, notably devices configured to exchange data with a reader via the antenna according to a contactless communication protocol.

Embodiments and applications of the invention relate more particularly to contactless communication between a contactless device and a reader at a frequency of 13.56 MHz, using active load modulation (ALM) for communication with the reader, and, more particularly, synchronization between a reader carrier signal and a carrier signal generated within the device (ALM carrier clock signal).

According to one aspect, a method of contactless communication between an object and a reader using active load modulation is proposed. The method comprises synchronization between a first carrier signal transmitted by the reader and having a reference frequency of 13.56 MHz, for example, and a second carrier signal extracted from the output signal of a controlled oscillator of a digital phase-locked loop of the object. The synchronization comprises latching the frequency of the output signal of the oscillator on a frequency which is a multiple of the reference frequency as long as a locking of the loop has not been detected. The oscillator is controlled with a first control signal generated from a first value representative of the phase error of the phase-locked loop. Once the locking has been detected, the latching continues while controlling the oscillator with a second control signal generated from a second value obtained by a modulo operation performed on the first value representative of the phase error of the loop.

The latching may be frequency latching or frequency and phase latching.

It should be noted here that "frequency which is a multiple of the reference frequency" is to be interpreted in the broad sense; that is to say, the multiple frequency is equal to k times the reference frequency where k is equal to or greater than 1.

We may also assume, for example, that the loop locking is detected if the phase error is below a threshold in absolute terms.

A person skilled in the art will be able to choose the value of this threshold on the basis of the application and/or the characteristics of the loop.

By way of non-limiting example, a threshold of about 30 degrees at 13.56 MHz may be chosen.

"First carrier signal" is taken to mean, for example, a clock signal which will be generated and injected into the receiving and transmission circuitry of the object emulated in card mode.

"Second carrier signal" is taken to mean, for example, a clock signal which will be generated and injected into the receiving and transmission circuitry of the object reader. The second signal also has the same reference frequency, in order to provide synchronous communication.

The oscillator is controlled by a first control signal, typically a digital control word, in order to generate the second carrier signal whose frequency is proportional to the first control signal applied to its input. When the problems described above occur, the first control signal, being affected by the first value representative of the phase error, makes it difficult or impossible to achieve convergence of the phase-locked loop, leading to instability. Consequently, the oscillator is advantageously controlled by the second control signal generated by the second value representative of the error.

The second value representative of the error well below the first value, because of the modulo operation on the first value. In this way, it is possible to make the phase-locked loop converge rapidly, while reducing the phase drift.

The second value representative of the error can be generated only after the locking of the phase-locked loop. This is because the modulo operation may cause phase jumps before the locking. Therefore the modulo operation is advantageously activated only after the detection of the locking.

As mentioned above, the oscillator may deliver a signal having a frequency equal to k times the reference frequency, where k is always greater than 1, for example a frequency of 867.84 MHz, or the reference frequency itself. If k is always greater than 1, this frequency will then be divided so as to produce the reference frequency, thus permitting synchronization between the reader and the object emulated in card mode.

Evidently, if the signal is at the reference frequency (k=1), the frequency will not be divided.

It should also be noted that the phase-locked loop is digital, advantageously enabling the loop to be stabilized, even with a high phase margin, for example a margin of more than 50°.

According to one embodiment, the first value is a digital word comprising a first sequence of bits, and the modulo operation comprises a selection of least significant bits representing a second sequence of bits representative of the second value.

The modulo operation makes it possible to reduce considerably the first value representative of the phase error of the loop, thus leading to a second value. For example, if the first value is 67, the phase-locked loop will attempt to reduce the error, and this may take some time before the loop can be made to converge towards 0. In this case, the modulo operation comprises, for example, the selection of the least significant bits, for example "0000011", corresponding to 3, of the first sequence which is "1000011", corresponding to 67. The error is therefore equal to 3.

This operation is repeated to make the phase error tend towards 0 and thus make the phase-locked loop converge rapidly.

According to one embodiment, the method comprises, before the latching by the loop, masking and/or multiplication of the frequency of the first carrier signal by a mask and/or a multiplicative factor.

Masking the frequency of a digital signal is taken to mean masking certain periods of the signal, and may therefore be related to frequency division.

The stability of the phase-locked loop is independent of the frequency of the first carrier signal, owing to the modulo operation. The frequency of the first carrier signal may therefore be multiplied by a multiplicative factor to enable the device emulated in card mode to operate on the rising edge and the falling edge of the first carrier signal.

Depending on the requirements of the system and its components, for example the antenna and its quality factor, the frequency of the first carrier signal may be masked by a mask.

It should be noted that it is possible to perform only one of the two operations or carry them out consecutively.

According to one embodiment, the mask or the multiplicative factor is adjustable.

The mask or the multiplicative factor may be chosen by a state machine on the basis of different parameters, for example the quality factor of the antenna.

A fixed multiplicative factor may also be chosen.

According to another aspect, an object capable of contactless communication with a reader using active load modulation is proposed. This object comprises an input for receiving a first carrier signal transmitted by the reader, an output for delivering a second carrier signal extracted from an output signal of a controlled oscillator of a digital phase-locked loop, and synchronization circuit configured for synchronizing the first carrier signal and second carrier signal. The synchronization circuit comprises a detector configured to detect the locking of the loop and a controller, as long as the detector has not detected the locking of the loop, latching the frequency of the output signal of the oscillator on a frequency which is a multiple of the reference frequency, by controlling the oscillator with a first control signal generated from a first value representative of the phase error of the phase-locked loop, and once the detector has detected the locking, continuing the latching by controlling the oscillator with a second control signal generated from a second value delivered by a first module configured to perform a modulo operation on the first value representative of the phase error of the loop.

According to one embodiment, the first value is a digital word comprising a first sequence of bits, the first module being configured to perform the operation by selecting least significant bits representing a second sequence of bits representative of the second value.

According to one embodiment, the synchronization circuit comprises a second module configured to mask the frequency of the first carrier signal with a mask before the latching by the loop, and a third module configured to multiply the frequency of the first carrier signal by a multiplicative factor before the latching by the loop.

The third module may have a conventional structure or may comprise, for example, a frequency doubler described in French patent application no. 1752114, which is incorporated herein by reference.

According to one embodiment, the division factor or the multiplicative factor is adjustable.

According to one embodiment, the phase-locked loop comprises a proportional-integral filter configured to filter the first value representative of the phase error and the second value representative of the phase error.

The object may be, for example, a cellular mobile telephone emulated in card mode.

BRIEF DESCRIPTION OF THE DRAWINGS

Other advantages and characteristics of the invention will be apparent from a perusal of the detailed description of embodiments and applications which are not limiting in any way, and the appended drawings, in which:

FIGS. 1 to 3, 4A, 4B, 4C, 5 and 6 show in a schematic way different applications and embodiments of the invention.

DETAILED DESCRIPTION OF ILLUSTRATIVE EMBODIMENTS

Figure 1:
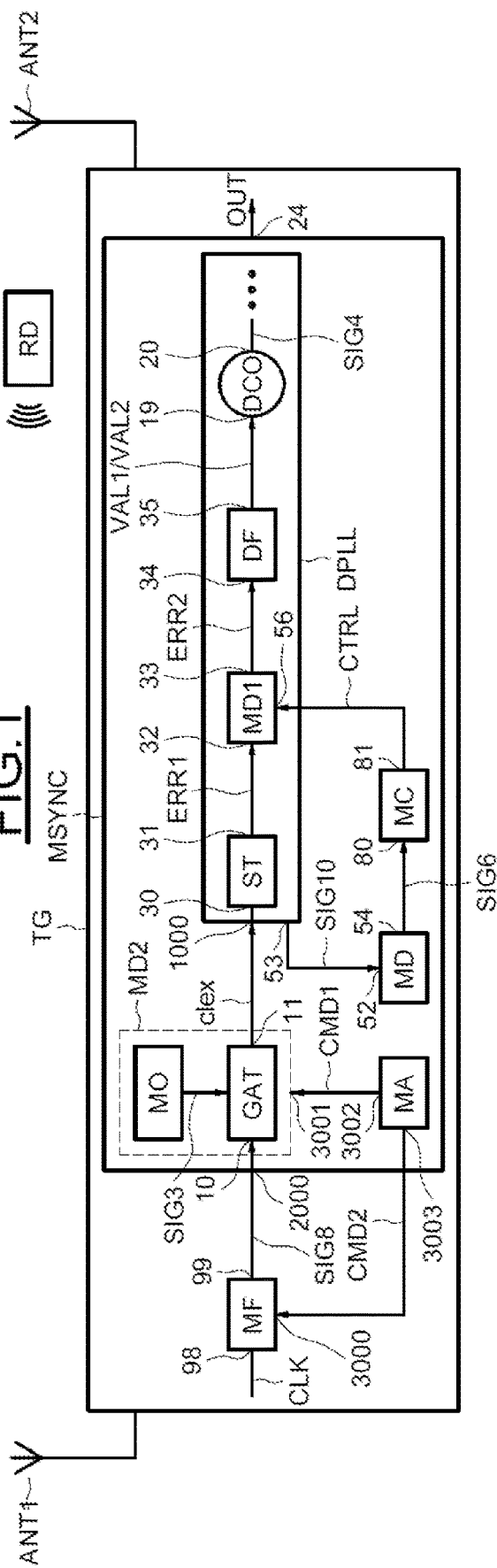

In FIG. 1, the reference TG denotes an object, for example, a cellular mobile telephone, including an antenna ANT1 for telephonic communication. In this case, the object is emulated in card mode and may, for example, communicate with a reader RD via another antenna ANT2, for example, an induction coil, using active load modulation, known as ALM (for "Active Load Modulation").

To communicate with the reader RD, the object TG comprises synchronization circuit MSYNC configured to receive, via an input terminal 2000 after processing, a first carrier signal CLK having a frequency of 13.56 MHz. This frequency is a reference frequency with which the object TG is to be synchronized, using the synchronization circuit MSYNC, during the communication of the object with the reader RD.

The object TG comprises a first module MD1 configured to perform a modulo operation, a second module MD2 configured to mask the frequency of a signal with a mask, and a third module MF, in this case a frequency multiplier configured to multiply the frequency of a signal by a factor.

The frequency multiplier MF is configured to receive the first carrier signal CLK via its input terminal 98, and to deliver via its output terminal 99 the first carrier signal CLK whose frequency has been multiplied by a factor, in this case SIG8. This signal SIG8 is then delivered to the synchronization circuit MSYNC via the input terminal 2000.

The synchronization circuit MSYNC comprises the second module MD2 configured to mask the frequency of the signal SIG8 using a mask.

The second module MD2 is controlled by a state machine MA configured so that, on the basis of different parameters, for example the factor of the antenna ANT2, it delivers a first control signal CMD1 via its output terminal 3002 to the second module MD2 via its input terminal 3001.

The state machine MA is also configured to deliver a second control signal CMD2 via its output terminal 3003 to an input terminal 3000 of the frequency multiplier MF.

One alternative is to continually multiply the frequency by a fixed multiplicative factor. In this case, the state machine MA is no longer coupled to the frequency multiplier MF.

The second module MD2 comprises a register MO configured to store a value SIG3 defined by the control signal CMD1 of the state machine MA. The second module MD2 also comprises a second module GAT configured to receive the signal SIG8 via its input terminal 10, and to mask it so as to deliver the signal clex via its output terminal 11.

The synchronization circuit MSYNC comprises a digital phase-locked loop DPLL including an oscillator DCO controlled by a digital signal (digital word) and configured to receive the signal clex via its input 1000 and to deliver on the output 20 of the oscillator DCO a signal SIG4 having a frequency which is a multiple of the reference frequency, for example 64×13.56 MHz.

The signal SIG4 is then processed to provide a second carrier signal OUT at the reference frequency, via an output 24.

For this purpose, the phase-locked loop DPLL comprises an adder-subtractor configured to receive the signal clex via its input terminal 30, and to deliver the signal ERR1 via its output terminal 31. The signal ERR1 is a digital signal representative of a first value of the phase error of the phase-locked loop.

The phase-locked loop DPLL also comprises the first module MD1 configured to receive the signal ERR1 on its input terminal 32, and to deliver the signal ERR2 via its output terminal 33. The first module MD1 is configured to perform a modulo operation on the signal ERR1. The result of the operation is the signal ERR2 which is representative of a second value of the phase error of the loop.

The signal ERR2 is then sent to an input terminal 34 of a digital filter DF of the phase-locked loop DPLL, configured to deliver a first control signal VAL1 or a second control signal VAL2 to the input 19 of the oscillator DCO.

Advantageously, the digital filter DF may be of the proportional-integral type, enabling the stability of the loop DPLL to be maintained by an appropriate choice of the poles of the filter.

Evidently, those skilled in the art may use any digital filter having the same characteristics. The synchronization circuit MSYNC also comprises a detector MD configured to detect the locking of the loop DPLL.

Figure 2:
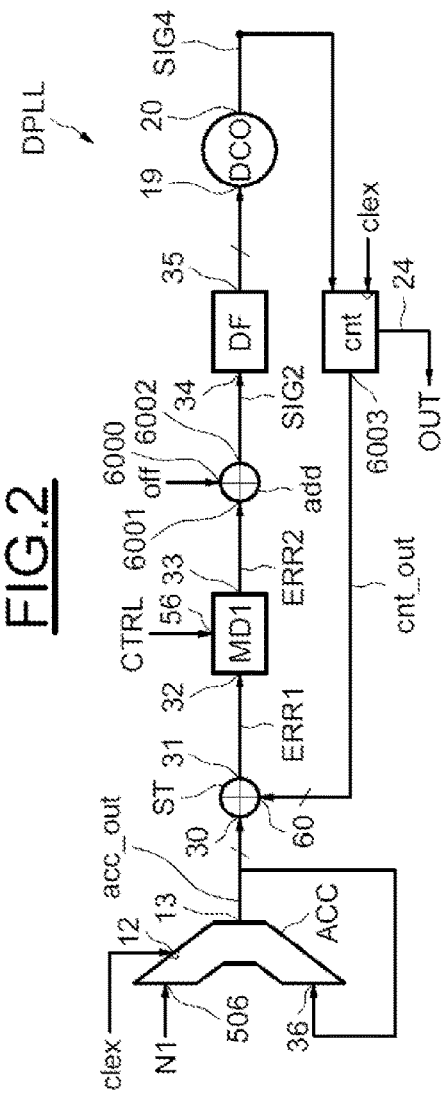

"Locking" is taken to mean the time required for the phase-locked loop to latch on and become stable. During this phase, some components of the loop, shown in FIG. 2, are saturated.

In order to detect the locking, the phase-locked loop DPLL is configured to deliver a signal SIG10 sign representative of the phase error of the loop, via its output terminal 53, to the input terminal 52 of the detector MD.

The detector MD is configured to compare the signal SIG10 with a threshold and deliver a signal SIG6 in the high state if the phase error is below the threshold in absolute terms.

In other words, the locking of the loop is detected if the signal SIG6 is in the high state.

The detector MD is configured to deliver the signal SIG6 via an output terminal 54 to a controller MC via an input terminal 8o.

The controller MD is configured to deliver a control signal CTRL via an output terminal 81 to an input terminal 56 of the first module MD1. The control signal CTRL is configured for, depending on its state, disabling the first module MD1 until the loop has been locked, or activating it after the locking of the loop DPLL so that it performs a modulo operation.

Another alternative would be a first state enabling a modulo 8×64 operation, for example, to be performed during the locking phase of the loop DPLL, to avoid adversely affecting its operation, and a second state enabling a modulo 64 operation to be performed after the locking of the loop.

If the first module MD1 is not activated, it will not perform a modulo operation, and the signal ERR1 will be the same as the signal ERR2. In other words, the output terminal 33 of the first module MD1 will deliver the signal ERR1. In this case, the digital filter DF is configured to deliver the first control signal VAL1.

If the first module MD1 is activated, it will perform the modulo operation and the digital filter DF will deliver the second control signal VAL2 via the output 35.

FIG. 2 shows a detailed view of the phase-locked loop DPLL.

The phase-locked loop DPLL comprises an accumulator ACC configured to be timed by the first carrier signal clex via a first input terminal 12, and also configured to receive a numeric value Ni, 64 in this case, via a second input terminal 506, and to receive, via a third input terminal 36, a signal acc_out delivered by the accumulator ACC via the output terminal 13.

The signal acc_out is delivered to the adder-subtractor ST via its input terminal 30, which will deliver the signal ERR1 via its output terminal 31. The signal ERR1 is received via the input terminal 32 of the first module MD1 which is configured to deliver the signal ERR2 and to be controlled by the signal CTRL delivered by the controller MD.

The signal ERR2 is sent to an adder add via its first input terminal 6001. The adder add is also configured to receive the signal off representing a static phase error via its second input terminal 6000, in order to compensate the phase errors of the matching circuit up to the antenna.

The adder add is configured to deliver, via its output terminal 6002, the signal SIG2 representing the result of the addition between the signal ERR1 and the signal off.

The digital filter DF is configured to receive the signal SIG2 via its input terminal 34 and to deliver the first control signal VAL1 or the second control signal VAL2 via its output terminal 35 to the input terminal 19 of the oscillator DCO according to the operating mode of the first module MD1.

The oscillator DCO is configured to deliver via its output terminal 20 the signal SIG4 which will be sent to a counter-divider cnt (a divider by 64 in this case) configured to deliver the second carrier signal OUT via the output terminal 24 and to deliver a signal cnt_out representative of the numeric counting result via its output terminal 6003 to an input terminal 60 of the adder-subtractor ST.

The circuit described above is advantageously digital in this case, since it enables the phase-locked loop to have a phase margin of more than 50°, allowing the loop to be stabilized.

FIG. 3 shows schematically the modulo operation performed by the first module MD1 when activated.

The signal ERR1 representative of the phase error of the loop DPLL is a signal composed of 7 bits in this case, representing a first unsigned sequence SQl It is assumed that the signal ERR1 has a value of 67, equivalent to a sequence SQ1 of "1000011". The modulo operation consists in selecting the least significant bits PF of the first sequence, in this case "000011", to form a second sequence SQ2 of 7 bits, "0000011" in this case, representing the numeric value 3.

In this case, the numeric value 3 is the signal ERR2 representative of the phase error of the phase-locked loop DPLL.

Thus the modulo operation allows a large reduction to be made in the error ERR1, and the control signal that will be delivered to the oscillator DCO will therefore result in a small correction enabling the loop to converge more rapidly.

FIG. 4A shows schematically an embodiment of the invention.

A first graph gr1 represents the variation with time of the signal acc_out delivered by the accumulator ACC and the signal cnt_out delivered by the counter-divider cnt.

The second graph gr2 represents the variation with time of the phase error E, equal to the difference between the signal acc_cnt and the signal cnt_out. It may be noted that the error E decreases progressively, and tends towards 0 at P3, due to the action of the phase-locked loop DPLL.

The period P1 corresponds to a period of absence of the first carrier signal CLK. The accumulator ACC, being timed by the signal clex extracted from the first carrier signal CLK, is fixed, and therefore the signal acc_out does not change during the period P1.

The signal cnt_out is timed by the oscillator DCO, and therefore continues to increase. The phase error E cannot be calculated, because the adder-subtractor ST is also timed by the signal clex. This is represented by the period P5 of the second graph gr2, where it may be seen that the error E no longer varies throughout the period P1 representing the absence of the first carrier signal CLK.

When the first carrier signal reappears, it may be seen that, in spite of the large difference between the signals acc_out and cnt_out represented by P2, the error E is not significant (P4) and tends towards 0. This is due to the modulo operation, in this case a modulo 64 operation, which has provided a significant reduction in the error E and ensured good phase tracking.

It may also be seen that the error E also tends towards 0 following the saturation of the counter-divider cnt. The phase-locked loop therefore converges more rapidly, thus enabling good phase tracking to be provided.

Figure 4B:
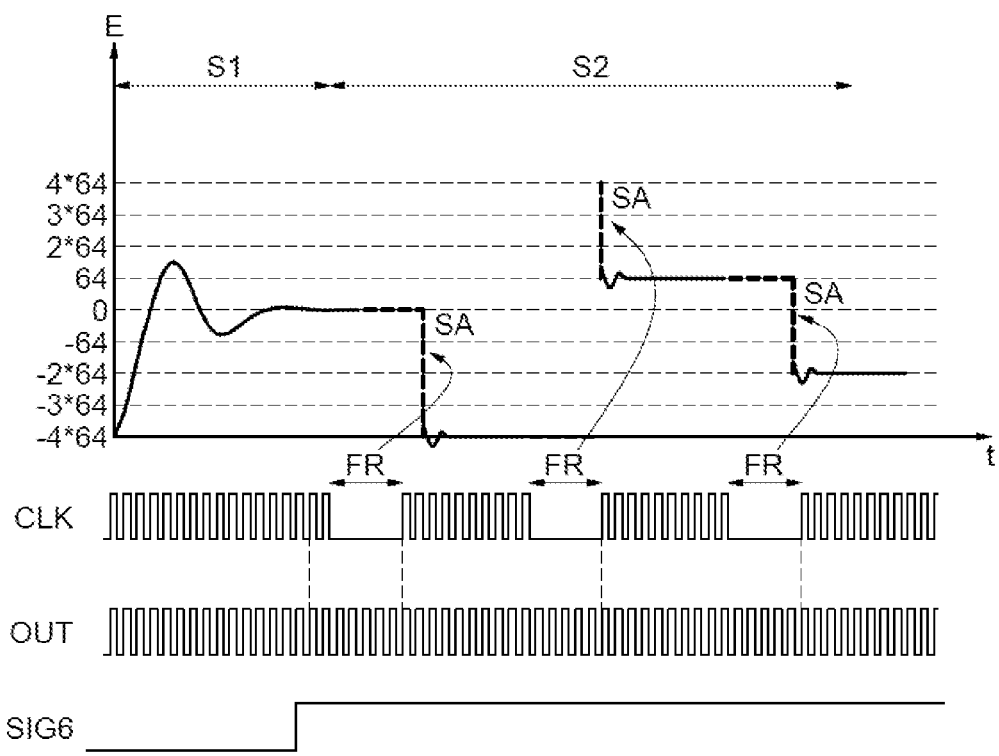

FIG. 4B shows the variation with time of the behavior of the phase-locked loop DPLL according to an embodiment of the invention.

A first period S1, representative of the locking phase of the phase-locked loop DPLL, is seen during the presence of the first carrier signal CLK.

When the loop has been locked, the signal SIG6, initially in the low state, changes to the high state.

The first carrier signal CLK is then absent during periods FR, resulting in a jump SA of the phase error E of the phase-locked loop after the return of the first carrier signal CLK, due to the offset between cnt_out and acc_out. Because of the action of the modulo, it may be noted that the phase-locked loop DPLL converges rapidly on each return of the first carrier signal CLK, thus avoiding phase drift.

The rapid convergence of the phase-locked loop DPLL enables the rising edges of the first carrier signal CLK to be aligned with the second carrier signal OUT, and the two signals are therefore synchronized.

Figure 4C:
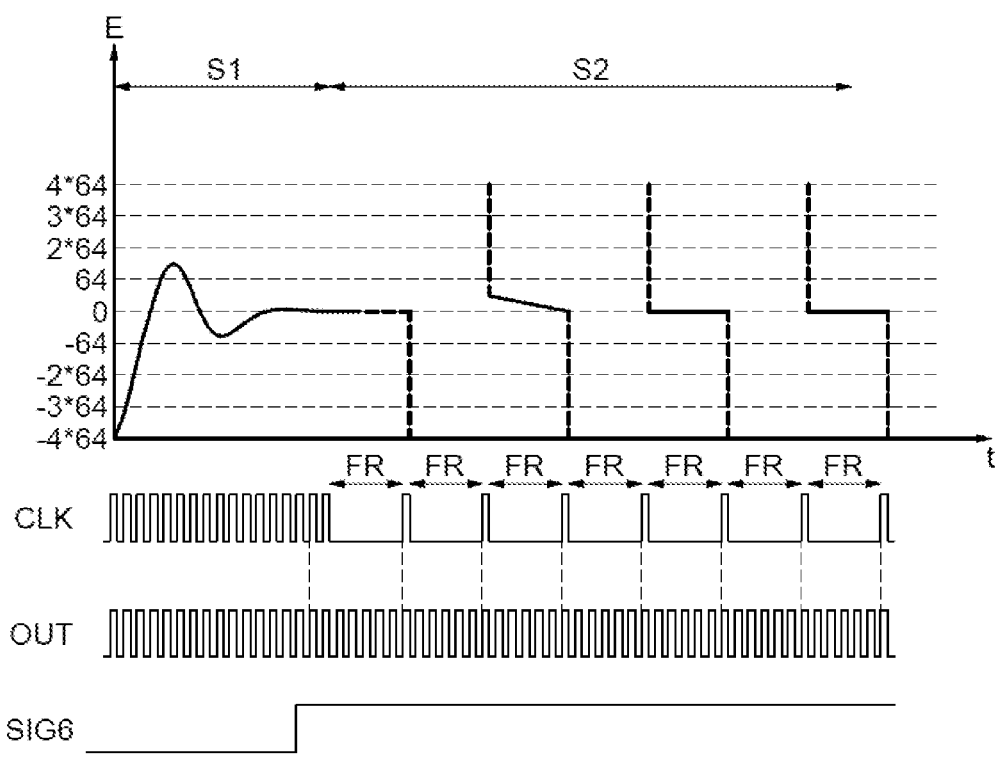

FIG. 4C shows the variation with time of the behavior of the loop DPLL according to an embodiment of the invention, and more precisely in the case of rapid bursts of responses of the object TG to the reader RD.

In this case, the residual energy in the antenna ANT2 after each burst of transmission limits the duration of the periods FR. The first carrier signal CLK is then usable for a shorter time, and the signal clex therefore has a lower frequency. Without the action of the modulo, this causes phase drift.

In this case, owing to the action of the modulo, after the locking (period S1) of the loop DPLL the loop can be made to converge rapidly during the period S2 and the rising edges of the first carrier signal CLK and the second carrier signal OUT can be aligned. Therefore, regardless of the sampling frequency of the first carrier signal CLK, the rising edges of the first carrier signal CLK and the second carrier signal OUT are aligned.

FIG. 5 shows the action of the second module MD2 on the signal clex.

During a data transmission TX, the data are encoded, by BPSK coding in this case, for transmission by the type B protocol at a speed of 848 kbps and in the case of bit reversal at each transmission. The coding results in a first carrier signal CLK comprising 32 periods of 13.56 MHz between each pulse.

Without the action of the modulo and the filter DF, which avoid the need to allow for the periods of absence of the first carrier signal CLK, the phase-locked loop DPLL can no longer be synchronous with the phase of the reader RD on every occasion. This results in a signal having a lower frequency, thus limiting the passband of the phase-locked loop DPLL, leading to instability.

To maintain the widest possible passband in order to optimize the noise rejection of the various modules and the variation of the frequency of the phase-locked loop DPLL, the correction of the phase error is advantageously performed as much as possible.

For this purpose, it is advantageous to restore the stable periods of the signal CLK extracted from the electromagnetic field of the reader as much as possible, even if the signal CLK is not periodic. Thus, in this context, the register MO, by sending the signal SIG3 to the second module, GAT enables the first carrier signal CLK to be masked, not in all 32 periods but by an optimal value which, for example, is specified as 24, 8, or any other value, enabling the passband of the phase-locked loop DPLL to be widened.

The division factor is chosen by the state machine MA on the basis of a number of parameters, for example the quality factor of the antenna ANT2.

Figure 6:
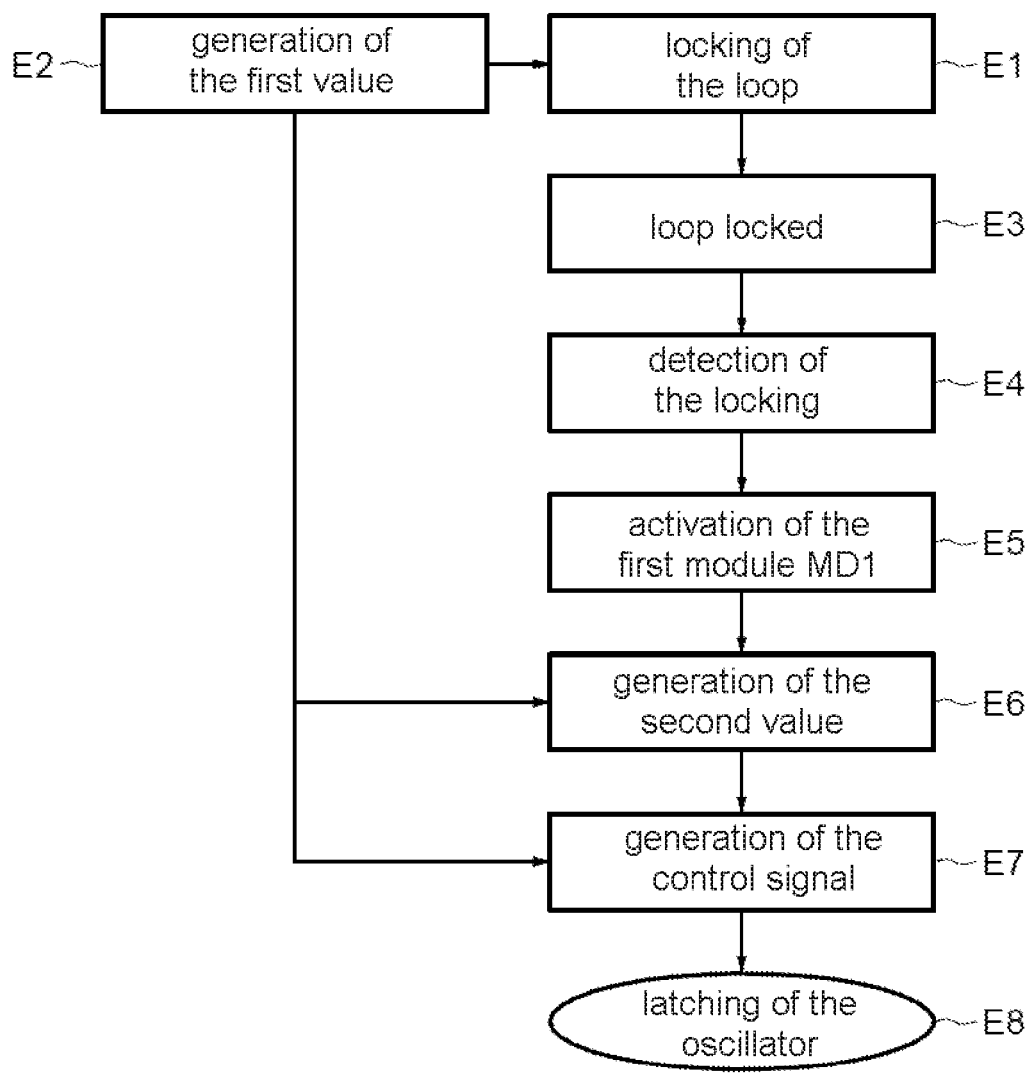

FIG. 6 shows a flow diagram representing an embodiment of the invention.

Steps E1 to E4 correspond to the period in which the phase-locked loop DPLL attempts to lock itself. For this purpose, in step E2 the adder-subtractor calculates the signal ERR1 representing the first value of the phase error of the loop DPLL, leading to the generation of the first control signal VAL1 in step E7.

The first control signal VAL1 is then delivered to the oscillator DCO in order to frequency latch it in step E8.

Once the loop has been locked (step E3), the detector MD detects the locking by receiving the signal SIG10, and delivers the signal SIG6 in the high state to the controller MC configured to activate the first module MD1 in step E5.

The adder-subtractor ST continues to deliver the signal ERR1 on which the modulo operation will be performed by the first module MD1, thus delivering the signal ERR2 in step E6 and leading to the generation of the second control signal VAL2 in step E7.

The second control signal VAL2 is then delivered to the oscillator DCO in order to frequency latch it in step E8.

Furthermore, the invention is not limited to these embodiments and applications, but includes all variants thereof.

For example, the modulo operation may be performed by modifying the depth of the counter-divider cnt and the accumulator ACC.

For example, the modulo operation may be performed by modifying the depth of the counter-divider cnt and the accumulator ACC.

What is claimed is:

1. A method of contactless communication between an object and a reader using active load modulation, the method comprising:
    performing a synchronization process between a first carrier signal transmitted by the reader and having a reference frequency, and a second carrier signal extracted from an output signal of a controlled oscillator of a digital phase-locked loop of the object, wherein the synchronization process comprises:
    as long as a locking of the loop has not been detected, latching the frequency of the output signal of the oscillator on a frequency that is a multiple of the reference frequency, the oscillator being controlled with a first control signal generated from a first value representative of a phase error of the phase-locked loop; and
    once the locking has been detected, continuing the latching while controlling the oscillator with a second control signal generated from a second value obtained by a modulo operation performed on the first value representative of the phase error of the loop.

2. The method according to claim 1, wherein the first value is a digital word comprising a first sequence of bits, and wherein the modulo operation comprises a selection of least significant bits representing a second sequence of bits representative of the second value.

3. The method according to claim 1, further comprising masking the frequency of the first carrier signal by a mask before the latching by the loop.

4. The method according to claim 3, wherein the mask is parameterizable.

5. The method according to claim 1, further comprising multiplying the frequency of the first carrier signal by a multiplicative factor before the latching by the loop.

6. The method according to claim 5, wherein the multiplicative factor is parameterizable.

7. The method according to claim 1, further comprising:
    masking the frequency of the first carrier signal by a mask before the latching by the loop; and multiplying the frequency of the first carrier signal by a multiplicative factor before the latching by the loop.

8. The method according to claim 7, wherein the mask is parameterizable.

9. The method according to claim 7, wherein the multiplicative factor is parameterizable.

10. An object capable of contactless communication with a reader using active load modulation, the object comprising:
   an input configured to receive a first carrier signal transmitted by the reader;
   an output configured to deliver a second carrier signal extracted from an output signal of a controlled oscillator of a digital phase-locked loop; and
   a synchronization circuit configured to synchronize the first carrier signal and second carrier signal, the synchronization circuit comprising:
   a detector configured to detect the locking of the loop;
   a controller configured to, as long as the detector has not detected the locking of the loop, latch the frequency of the output signal of the oscillator on a frequency that is a multiple of a reference frequency, by controlling the oscillator with a first control signal generated from a first value representative of a phase error of the phase-locked loop; and
   once the detector has detected the locking, to continue the latching by controlling the oscillator with a second control signal generated from a second value delivered by a first module configured to perform a modulo operation on the first value representative of the phase error of the loop.

11. The object according to claim 10, wherein the first value is a digital word comprising a first sequence of bits, and wherein the first module is configured to perform the operation by selecting least significant bits representing a second sequence of bits representative of the second value.

12. The object according to claim 10, wherein the synchronization circuit further comprises a second module configured to mask the frequency of the first carrier signal with a mask before the latching by the loop.

13. The object according to claim 10, wherein the synchronization circuit further comprises a third module configured to multiply the frequency of the first carrier signal by a multiplicative factor before the latching by the loop.

14. The object according to claim 10, wherein the synchronization circuit further comprises a second module configured to mask the frequency of the first carrier signal with a mask before the latching by the loop, and a third module configured to multiply the frequency of the first carrier signal by a multiplicative factor before the latching by the loop.

15. The object according to claim 14, wherein the mask is parameterizable.

16. The object according to claim 14, wherein the multiplicative factor is parameterizable.

17. The object according to claim 10, wherein the phase-locked loop comprises a proportional-integral filter configured to filter the first value representative of the phase error and the second value representative of the phase error.

18. The object according to claim 10, wherein the object comprises a telephone emulated in card mode.

19. An object capable of contactless communication with a reader using active load modulation, the object comprising:
   an input configured to receive a first carrier signal transmitted by a reader;
   a digital phase-locked loop that comprises a controlled oscillator;
   an output configured to deliver a second carrier signal extracted from an output signal of the controlled oscillator;
   a detector configured to detect the locking of the digital phase-locked loop;
   a controller configured to:
      as long as the detector has not detected the locking of the loop, latch the frequency of the output signal of the oscillator on a frequency that is a multiple of a reference frequency, by controlling the oscillator with a first control signal generated from a first value representative of a phase error of the phase-locked loop; and
      once the detector has detected the locking, to continue the latching by controlling the oscillator with a second control signal generated from a second value delivered by a first module configured to perform a modulo operation on the first value representative of the phase error of the loop.

20. The object according to claim 19, further comprising:
   a second module configured to mask the frequency of the first carrier signal with a mask before the latching by the loop; and
   a third module configured to multiply the frequency of the first carrier signal by a multiplicative factor before the latching by the loop.

* * * * *